United States Patent [19]

Calhoun

[11] Patent Number: 5,216,543
[45] Date of Patent: Jun. 1, 1993

[54] APPARATUS AND METHOD FOR PATTERNING A FILM

[75] Inventor: Clyde D. Calhoun, Grant Township, Minn.

[73] Assignee: Minnesota Mining and Manufacturing Company, St. Paul, Minn.

[21] Appl. No.: 021,458

[22] Filed: Mar. 4, 1987

[51] Int. Cl.$^5$ .................. G02B 27/00; H01L 31/00; B23K 26/00; G03F 9/00

[52] U.S. Cl. .................. 359/619; 359/626; 136/246; 136/259; 219/121.67; 219/121.75; 219/121.77; 219/121.85; 428/209; 428/344; 428/354; 430/5; 430/14; 430/22; 430/270; 430/396; 430/495; 430/946

[58] Field of Search .............. 219/121.69, 121.67; 428/601, 626, 46; 430/946, 945, 4, 5, 9, 13, 14, 270, 271, 311, 321, 495, 501; 346/77 E, 151; 136/246, 259, 243, 244, 249; 283/109, 904

[56] References Cited

U.S. PATENT DOCUMENTS

| | | | |
|---|---|---|---|
| 2,888,007 | 5/1959 | Tabor | 350/167 X |
| 3,085,473 | 4/1963 | Bourgeaux et al. | 350/167 |
| 3,284,208 | 11/1966 | Land | 430/946 |
| 3,291,555 | 12/1966 | Browning | 359/664 |
| 3,520,588 | 7/1970 | Salyer et al. | 430/946 |
| 3,586,813 | 6/1971 | Cruickshank et al. | 350/167 X |
| 3,586,816 | 6/1971 | Hagan | 219/121.63 |
| 3,600,063 | 8/1971 | Bowen | 350/167 |
| 3,617,281 | 11/1971 | Lindin | 430/946 |
| 3,617,702 | 11/1971 | Flournoy | 219/384 |
| 3,724,924 | 4/1973 | Lenfant et al. | 350/167 |
| 3,802,101 | 4/1974 | Scantlin | 283/904 |
| 3,973,954 | 8/1976 | Bean | 430/946 |
| 3,977,904 | 8/1976 | Köhler | 350/167 X |
| 3,985,419 | 10/1976 | Matsumoto et al. | 359/900 |
| 4,017,332 | 4/1977 | James | 136/249 TJ |
| 4,069,812 | 1/1978 | O'Neill | 126/271 |
| 4,172,219 | 10/1979 | Demi et al. | 219/121 LM |
| 4,306,278 | 12/1981 | Fulton et al. | 372/75 X |
| 4,313,984 | 2/1982 | Moraw et al. | 283/109 |
| 4,360,570 | 11/1982 | Andreades et al. | 428/601 |
| 4,414,316 | 11/1983 | Conley | 430/946 |
| 4,456,783 | 6/1984 | Baker | 350/167 X |
| 4,545,366 | 10/1985 | O'Neill | 126/440 |
| 4,638,110 | 1/1987 | Erbert | 136/246 |
| 4,680,855 | 7/1987 | Yamazaki et al. | 219/121.69 |
| 4,695,674 | 9/1987 | Bar-on | 136/256 |
| 4,705,698 | 11/1987 | Van Dine | 219/121.69 |
| 4,713,518 | 12/1987 | Yamazaki et al. | 219/121.69 |
| 4,755,475 | 7/1988 | Kiyama et al. | 219/121.69 |
| 4,852,972 | 8/1989 | Wah Lo | 359/900 |
| 4,874,920 | 10/1989 | Yamazaki et al. | 219/121.75 |
| 4,920,039 | 4/1990 | Fotland et al. | 430/946 |

OTHER PUBLICATIONS

Machida et al, "High Efficiency Fiber Grating for Producing Multiple Beams of Uniform Intensity", *Applied Optics*, vol. 23, No. 2, Jan. 15, 1984, pp. 330–332.
Document received from Entech, Inc.

*Primary Examiner*—Bruce Y. Arnold
*Assistant Examiner*—R. D. Shafer
*Attorney, Agent, or Firm*—Gary L. Griswold; Walter N. Kirn; Warren R. Bovee

[57] ABSTRACT

The present invention relates to an apparatus and method for patterning areas of a radiation absorbent film material. In the preferred embodiment, the film material is at least partially electrically conductive. The radiation is focused onto the film by a lenticular lens having a plurality of optically active elements to provide a radiation pattern on the film and remove or displace portions of the film to form a corresponding pattern, preferably a conductive pattern. The film may have one or more layers or regions, but at least one region must be radiation absorbent in order to allow the formation of patterns in the film in accordance with the present invention. The areas of the film affected by the phenomenon of radiation absorption are non-conductive voids which may separate the film into a plurality of conductive grid lines whereby the film is useful with a conductive lens film to increase the apparent efficiency of a photovoltaic cell.

4 Claims, 2 Drawing Sheets

APPARATUS AND METHOD FOR PATTERNING A FILM

FIELD OF THE INVENTION

The present invention relates to patterned films, particularly electrically conductive films, and to a method and apparatus for patterning films by focusing electromagnetic radiation thereon to remove or displace portions of the film. A patterned, conductive film can be used as a conductive grid pattern in combination with a photovoltaic cell and a lenticular lens to increase the efficiency of the photovoltaic cell.

BACKGROUND OF THE INVENTION

It is well known to those skilled in the art to utilize a finely focused laser beam to cut various materials both organic and inorganic, which have found widespread commercial use. It is further known to utilize such devices to etch or scribe multi-layer constructions comprising laminae, of for example, an inorganic support or substrate bearing a metallic layer thereon, wherein the metallic layer is selectively removed by the laser. However, when it is desirable to provide a complex pattern such as, for example, an array of closely spaced metallic stripes on a dielectric support, known laser scribing techniques are unsatisfactory because of the excessive time required to accomplish scribing, and because of the complex and costly apparatus necessary to precisely position and scan the laser when utilizing a single source of laser radiation.

It has been proposed to utilize lenticular lens arrays in the form of thin sheets to concentrate solar energy as disclosed by Baker in U.S. Pat. No. 4,456,783 and Adcock in U.S. Pat. No. 4,446,853. U.S. Pat. No. 4,456,783 describes a thin optical panel formed of two, preferably identical, but opposed, spaced lenticulated plates structured to form a series of regularly spaced apart line images of the sun with the line images thus formed being tracked with an array of silicon ribbons or the like to convert solar energy to electrical energy.

U.S. Pat. No. 4,306,278 discloses a semiconductor laser array system including a plano-cylindrical inner lens of relatively short focal length for each row of laser elements. In such an array, the flat surface of the lens adjacent the laser radiation emitting source and a second single plano-cylindrical lens are combined with the rows of inner lenses to yield an assembly providing essentially complete culmination (as opposed to focusing to a fine line) of the laser radiation.

U.S. Pat. No. 3,600,063 by Bowen discloses a varifocal beam spreader positioned in the path of a light beam (especially a laser) for varying the light beam divergence angle while maintaining a uniform intensity of illumination. The spreader includes a lenticular plate comprising a series of elongated lenslets forming a series of parallel semicircular tubes. The radiation source is, as in U.S. Pat. No. 4,306,278, incident on the flat surface of the lenticular plate, and the apparatus does not provide for focusing of the radiation to fine lines.

SUMMARY OF THE INVENTION

The present invention provides a method and means for patterning films using a single, focused source of radiation, such as a laser, and an optical element, such as a lenticular lens, for focusing a single source of radiation into an array of radiation beams arranged in a desired pattern.

The method and apparatus of the present invention allows the precise patterning of radiation responsive films by a radiation source wherein the pattern is dictated by a selected optical element rather than solely by a precision scanning mechanism associated with the radiation source. The method and apparatus described in the present invention can provide a patterned film by directing the radiation to an optical element and then onto the surface of a radiation responsive film material which is separated from the optical element to produce a radiation pattern on the film. The radiation responsive film is preferably a film which absorbs the radiation and is thereby volatilized or otherwise removed or displaced in the areas where the radiation is incident on the film.

The patterned films produced in this invention may be associated with a supporting substrate or other functional layers, including conductive and/or adhesive layers for attaching the films to various materials and serving electrically conductive and connective functions. In one embodiment, a film having an array of narrow, spaced-apart parallel lines of metallic material and having a conductive adhesive associated therewith can serve as an electrical connecting medium.

A preferred conductive film according to the present invention comprises a first layer of a radiation transmissive material and having first and second major surfaces. A second layer of a conductive, radiation-absorptive material is disposed along the second major surface of the first layer, and the second layer includes a conductive pattern comprising a plurality of conductive regions separated by non-conductive regions. A third layer of material may be disposed on the second layer and may include a coating of an adhesive composition and/or a protective layer. When the conductive portions of the second layer are of an electrically conductive material separated by non-conductive, optically transmissive portions, and the first major surface includes a plurality of prism elements, the conductive film is particularly useful in combination with photovoltaic cells to focus incident light and promote the efficient free flow of electrons within the cell. Further, additional conductive layers of either a radiation absorptive or radiation reflective material may be applied to the second layer of conductive material.

Apparatus to practice the method of this invention includes a radiation source for emitting and directing radiation to a lenticular lens. The lenticular lens focuses the incident radiation to form a pattern on a film associated with, but separate from, the lens. The lens and film may be held separate and moved relative to one another by a variety of conventional means. Exposure of the film to the focused radiation results in the removal or displacement of at least a portion of the film to form a pattern corresponding to the focused radiation.

DESCRIPTION OF THE DRAWINGS

The present invention will be more fully described with reference to the accompanying drawings wherein like reference numerals identify corresponding elements, and.

DETAILED DESCRIPTION OF THE INVENTION

Figure 1:
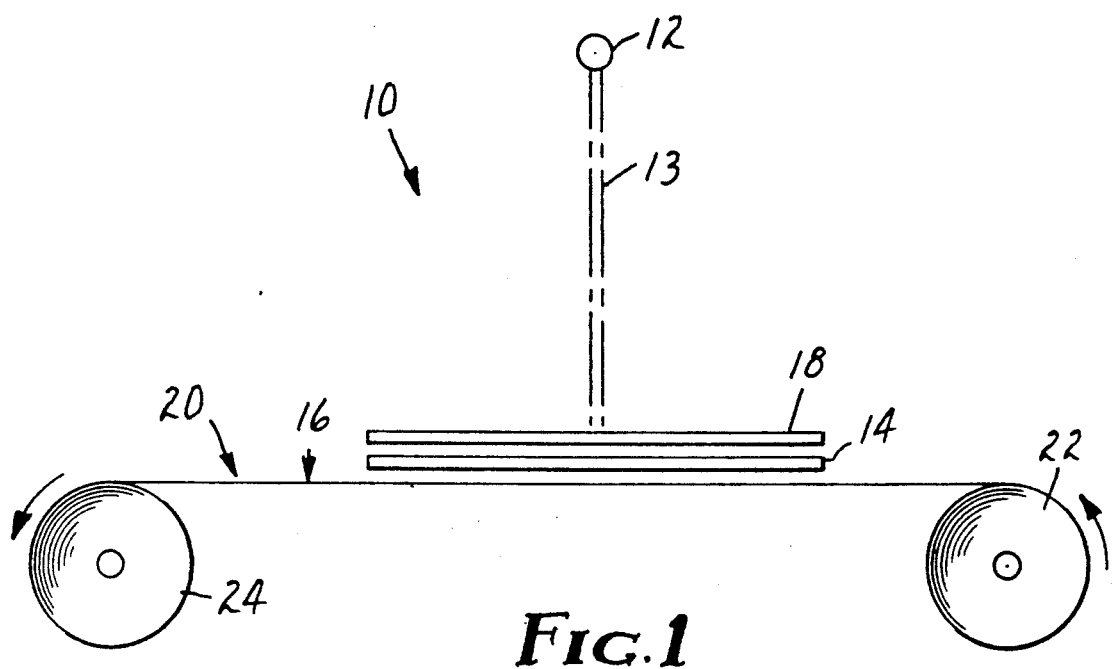
FIG. 1 is a schematic representation of the patterning apparatus of the invention.

Referring to FIG. 1 of the drawings, the apparatus of the present invention, generally designated 10, may be used for focusing radiation from a source 12 through a lenticular lens 14 onto a radiation absorbent film shown generally at 16 separated from lens 14. Film 16 may be a single self-supporting layer or may be a composite, multi-layer film as will be explained in greater detail hereinafter. A conveyer assembly 20, including supply roll 22 and associated take-up roll 24, is used to maintain the film 16 separate from the lens 14 and may also be used to move the film 16 relative to the lens 14 in various directions relative to the lens position prior to, during and after exposure of the film to the radiation.

The radiation source 12 may include a variety of known laser devices as long as the lens 14 transmits and focuses substantial radiation from the source 12 onto the film 16. A stencil 18 may be positioned between the source 12 and the lens 14 to prevent radiation from striking the lens 14 at certain areas to assist in forming certain patterns on the film 16.

Figure 2:
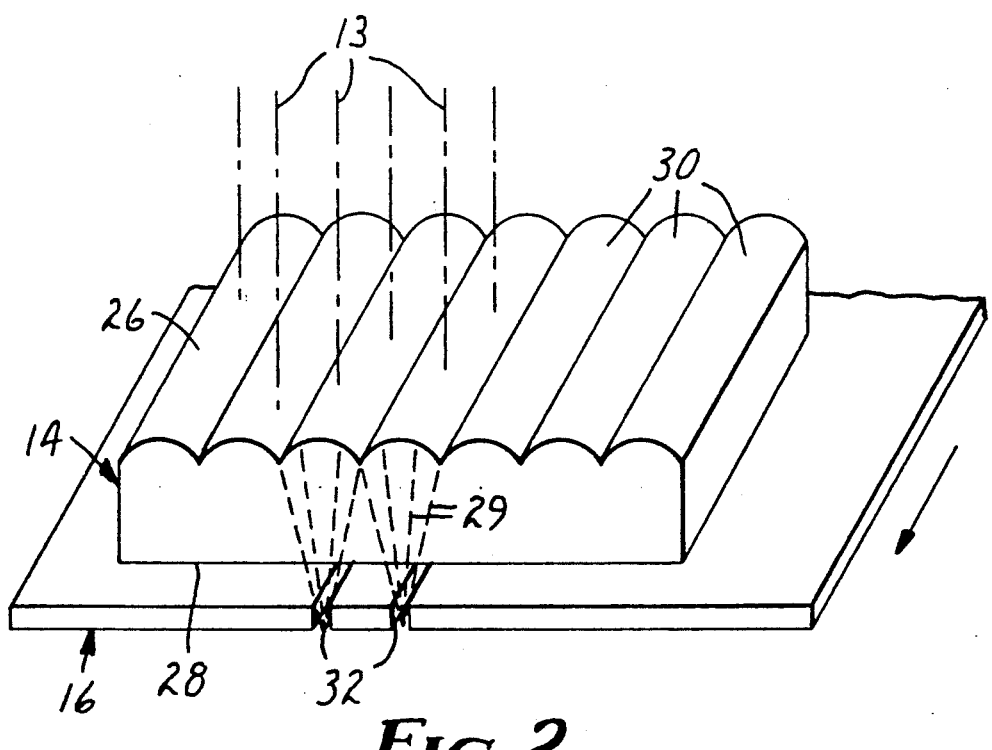
FIG. 2 is an enlarged fragmentary cross-section of a lenticular lens and the film shown generally in FIG. 1.

As illustrated in FIG. 2, the lenticular lens 14 is of a transparent material and includes a structured surface 26 on one major surface and a smooth surface 28 on the opposite surface. The structured surface has formed thereon an array of optically active prism elements or lenslets 30. The elements 30 may be formed by known techniques including, for example, embossing, stamping, molding or the like. The width and spacing of the prism elements 30 may vary over a considerable range depending upon the intended application. A typical frequency of elements would include at least about 4 per centimeter to about 400 per centimeter. While the prism elements, as shown, are generally of a cylindrical nature, the instant invention is not limited to the use of elements of this type, but may include elements having a spherical shape as well as elements having a non-circular conic section with, for example, a parabolic section providing suitable optical performance. Additionally, the degree of curvature of the prism elements 30 may be varied to yield a suitable focal length.

In use, the radiation from source 12 is directed onto lens 14. The light rays 29 are focused by the lenslets 30 on to selected areas of film 16 in the form of a pattern corresponding to the pattern of the lens elements 30 of lens 14. The film 16 may be in direct contact with or separated from lens 14. The film 16 absorbs the radiation caused localized heating of film to the point where the film material is vaporized or otherwise disrupted or displaced to form discontinuities 32 in the area where the heating occurs. The discontinuities may be in the form of holes, slits, or other form of discontinuities. The lens 14 causes the radiation emitted from the source 12 to be focused in a precise pattern without having to move the source 12 to precisely trace the pattern. Further patterning can be achieved by moving the film 16 relative to the lens 14 either parallel to the lens elements or transverse thereto or both. In addition, moving film 16 relative to the lens allows patterning a large area of film with a relatively small lens such as by moving the film from the supply reel 22 to the take-up reel 24 as shown in FIG. 1. In order to accomplish relative movement of the film 16 and the lens 14 either the lens and light source assembly may be moved while the film remains stationary or the film may be moved while the lens remains stationary or both may be moved at the same time.

The prism elements of the lens can be of a cylindrical nature, as shown in the drawing, or may include elements having (1) curved surfaces or (2) multiple flat facets. The curved surfaces can be cylindrical or parabolic, or variations thereof, so long as the lens is able to focus the laser energy to the desired width at the appropriate distance.

It is also contemplated that the lenticular lens may have a structured surface which is internally reflecting so that the radiation may be focused and reflected onto the absorbent film. When using such a lens, the radiation source would be arranged to direct light onto the reflecting surface of the lens rather than through the structured surface of the lens as shown in FIG. 1.

The laser source must provide sufficient energy, when concentrated by the lens, to provide the desired patterning effect. The use of a high powered laser with very short duration exposure will decrease the heat transfer to areas surrounding the spot on which the light is focused resulting in sharp, well-defined patterns. Exposure for longer periods provides an opportunity for heat transfer to surrounding areas which affects the width of the pattern.

Figure 3:
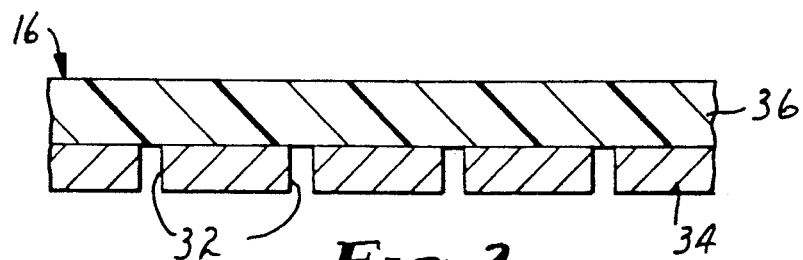
FIGS. 3, 4 and 5 are cross sections of various constructions of patterned films according to the present invention.

Film 16 may be a single self-supporting layer of radiation absorbent material or may be a composite structure containing one or more layers of radiation absorbent material and one or more layers of radiation transmissive and/or non-absorbent material depending on the location of the layer relative to the radiation source and the use for which the patterned article is intended. For example, FIG. 3 shows a composite film 16 comprising a supporting layer 36 adjacent radiation absorbent material 34 separated by discontinuities 32. The absorbent material may be conductive and is preferably electrically conductive for certain electrical applications. The supporting material 36 must be optically transparent if the radiation source is intended to reach the radiation absorbent material 34 through layer 36. Layer 36 acts as a separating layer to separate the absorbent layer 34 from the lens. However, if the radiation is incident on layer 34 from the opposite side, then layer 36 need not be transparent. If layer 36 is intended to remain intact during the application of radiation to the film 16, then the layer should not absorb a significant amount of radiation in the wavelengths transmitted by the source. If absorbent layer 34 is self-supporting, layer 36 could be applied after patterning layer 34.

Alternatively, absorbent layer 34 may itself be a composite layer comprising transparent or reflective layers which by themselves could not be patterned by the radiation source. For example, metallic reflective materials, such as silver, can not ordinarily be cut with a laser because not enough light is absorbed by these reflective materials to cause them to reach their melting or vaporization points. However, if a thin layer of absorbent material, such as titanium, is placed on top of the reflective material, then the material may be patterned. This is believed to occur because the absorbent material absorbs enough energy to transfer sufficient heat to the adjacent, reflective material by conduction to bring its temperature above the melting or vaporization point and cause localized displacement of the reflective material as well. Obviously, the absorbent material must be such as to absorb sufficient energy to bring about transformation of the adjacent, reflective layer. Preferably the absorbent material should have a higher melting point, vaporization or displacement temperature than the associated reflective material.

Figure 4:
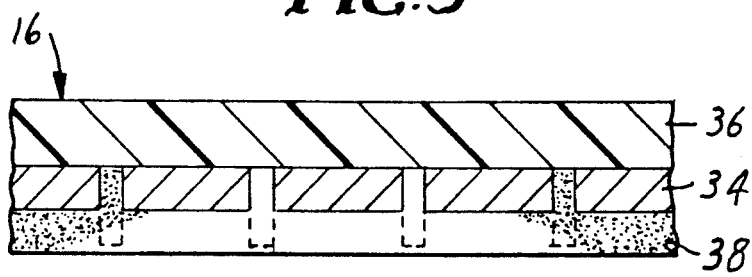

FIG. 4 shows another embodiment of the film of this invention wherein absorbent material 34 and layer 36, as described above, are combined with a third layer 28 applied after removing portions of the absorbent layer 34. Layer 28 may be an adhesive material which fills the voids in absorbent layer 34. Layer 28 could be applied subsequent to patterning the absorbent layer 34. Alternatively, layer 28 can be an electrically conductive, radiation absorbent adhesive which is applied to layer 34 prior to patterning and is removed or displaced in the same regions as layer 34 (as shown by the dotted lines) to form an electrically conductive pattern which can be adhesively bonded to electrical terminals, e.g., a multiconductor electrical connection tape.

Figure 5:
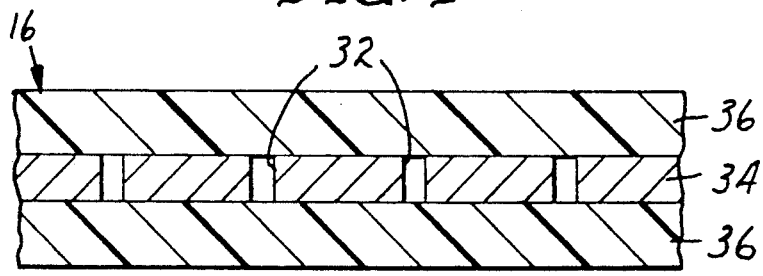

FIG. 5 shows a material prepared as in Example 5 herein. Film 16 is a composite film comprising absorbent aluminum layer 34 disposed between a pair of transparent polyester supporting substrates 36. Layers 36 are applied to the layer 34 prior to patterning and because they are transparent to the radiation source, only layer 34 is disrupted in the patterning process. Alternatively, layers 36 may be organic or inorganic materials such as polymeric films, metal foils, transparent oxides, and the like, provided sufficient transparency is provided where needed.

The films described herein find a variety of uses, particularly where separate, electrically insulated, conductive patterns are useful, such as in various electrical connecting applications, electrical cables, printed circuit boards, and the like. The patterned films are particularly useful in combination with a lenticular lens to improve the efficiency of photovoltaic cells as will be described more fully hereinafter. For many applications it is desirable to pattern conductive films to provide a group of parallel, spaced apart conductors insulated from one another. These can be readily prepared by the methods described in the present invention with precisely controlled spacings of as little as 10 micrometers between conductors.

Figure 6:
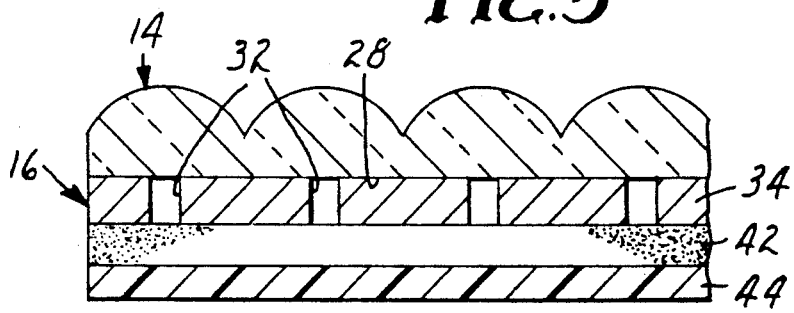
FIG. 6 is a cross section of an optical device comprising a lenticular lens having associated therewith a conductive, patterned region and an adhesive bonding layer covered by a protective release liner.

FIG. 1 illustrates a mode of operation wherein the focal length of the lenticular lens 14 is spaced apart from the film 16 by the film support assembly. This invention also contemplates utilization of lenticular lenses having shorter focal lengths wherein the lens is in direct physical contact with the absorbent layer 34 and forms a part of the film 16. FIG. 6 illustrates a lens-film combination where the radiation absorbent layer 34, preferably an electrically conductive material, is deposited directly on the smooth surface 28 of the lens 14 whereby subsequent exposure to laser radiation yields an integral, conductive, absorbent layer 34 comprising a series of parallel spaced-apart conductive portions, or grid lines, separated by non-conductive areas 32. Optionally, an electrically conductive, pressure-sensitive adhesive layer 42 which may be substantially transparent or may be opaque may be applied to layer 34 to facilitate attaching the lensfilm 16 to various surfaces.

The particular adhesive employed is not essential to the present invention, however, conductive adhesives are of particular interest because of their electrical conductivity. Useful materials are disclosed in, for example, U.S. Pat. No. 4,546,037 and U.S. Pat. No. 4,548,862, the disclosures of which are hereby incorporated by reference. To protect the adhesive coating, a protective film 44 may be applied thereto. It is preferred that the protective film 44 have a release surface to permit it to later be peeled from the adhesive coating to expose it so that the resultant article may be adhered to various surfaces, for example the surface of a photovoltaic cell. Useful protective films include polycarbonate, polymethylmethacrylate, polystyrene, and biaxially-oriented polyethylene terephthalate or various silicone coated release papers.

Figure 7:
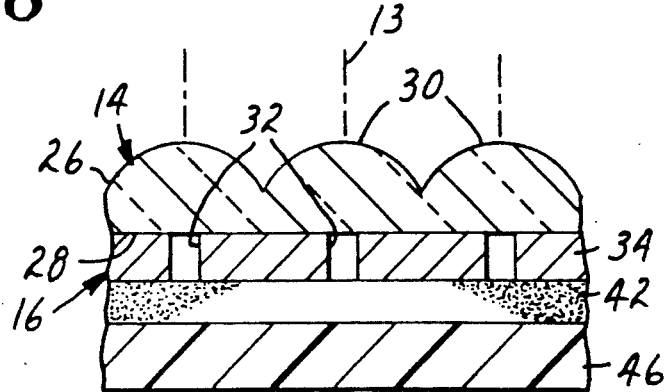
FIG. 7 is a cross-section of a photovoltaic device.

When the embodiment shown in FIG. 6 is applied to a photovoltaic cell 46, as shown in FIG. 7, the lens serves to focus all of the light incident thereon toward the openings between the conductive grid lines which serve as electrical "collectors" for the free electrons generated by the cell in response to the incident light. Without the focusing lens, a portion of the incident light would be blocked by the gridlines and would not reach the active areas of the cell. By focusing the light in this manner, the light which would otherwise be absorbed or reflected by the grid lines is directed onto the cell and the efficiency of the cell can be significantly increased. By patterning the conductive grid using the focusing lens as the patterning lens, the spaces between the grid lines necessarily correspond to the focal point of the lens so that the lens and the grid pattern can be properly registered.

The objects and advantages of the present invention are further illustrated by reference to the following examples.

EXAMPLE 1

Aluminum was vapor coated, using a bell jar system, to a thickness of about 100 nm onto the smooth surface of a cylindrical array lenticular lens having 67 prism elements per linear centimeter. The structured surface of the lenticular lens was exposed to a Quanta-Ray DCR-2A YAG laser as manufactured by Quanta-Ray, a subsidiary of Spectra Physics Corp. The focusing means incorporated two lenses, one utilizing a concave element with a focal length of about −25 cm and the other utilizing a convex element having a focal length of about +120 cm, the distance between the two being adjusted to yield a spot diameter of about 6.4 cm at the sample. Power readings taken prior to exposure (−25 lens alone and power cell 25 cm from this lens) indicated a power of about 8 watts. With the laser operating at about 80 amps and a frequency of 10 Hz, aluminum was selectively removed along the focal lines of the lenticular lens to yield about 67 parallel spaced-apart strips or grid lines of aluminum per linear centimeter with each conductive aluminum strip having a width of about 120 microns.

EXAMPLE 2

An alloy having a composition of 80 wt % nickel and 20 wt % iron (Ni-20 wt % iron) was evaporated, using a bell jar apparatus, and subsequently deposited onto a polyester film of about 50 microns thickness. The thickness of the deposited Ni-20 wt % iron layer was about 120 nm. The smooth surface of a cylindrical array lenticular lens of Example 1 was placed in contact with the Ni-20 wt % iron layer. A YAG laser beam, Model 532 Q as manufactured by Control Laser Corp. of Orlando, Fla., was subsequently directed at the structured surface of the lenticular lens. The apparatus further incorporated a galvo attachment, as manufactured by General Scanning Corp. of Watertown, Mass., which provided for rastering of the laser beam. The laser beam was thus rastered over a width of about 2.5 cm in a direction perpendicular to the prism elements and swept at a rate of about 76 cm/min. over a length of about 5.0 cm in a direction parallel to the prism elements to provide an exposed area of about 12.5 cm$^2$. During exposure, the laser was operated at a power level of about 32 amps and a frequency of about 5 KHz with a spot diameter of about 6 mm. The distance from the galvo mirror to the Ni-20 wt % iron layer was about 64 cm. Ni-20 wt % iron was selectively removed along the focal lines of the lenticular lens yielding about 67 parallel, spaced-apart strips of Ni-20 wt % iron, per linear centimeter, each line having a width of about 120 microns and separated by about 20 microns.

EXAMPLE 3

The Ni-20 wt % iron layer described in Example 2 was deposited on a 50 micron polyester substrate. The Ni-20 wt % iron layer was electron beam evaporated onto a polyester film to a thickness of 120 nm. The smooth surface of the lenticular lens of Example 1, having about 67 lines/centimeter, was brought into contact with the Ni-20 wt % iron and exposed with radiation from the laser as described in Example 2. The lenticular lens was then rotated 90° and exposed a second time to radiation from the laser. The result was that the Ni-20 wt % iron layer was divided into squares at a density of approximately 4,489 squares per square centimeter.

EXAMPLE 4

Polyimide was coated with a Cu layer about 10 nm in thickness which in turn was overcoated with an Au layer about 50 nm in thickness. The resistivity of the bilayer was one ohm per square. Using the laser and method of Example 2 at a power of 33 amps and a frequency of 5 KHz, the smooth surface of the lenticular lens of Example 1 was brought in contact with the Au layer, and both metal layers were cut to 67 lines per centimeter. A second lenticular lens having an identical structured surface, but thinner, was used to cut the same Au/Cu layers but with the modification that the smooth surface of the lenticular lens was in contact with the polyimide so that the Au/Cu layer was spaced from the lens. In other words, the laser beam passed through the substrate (polyimide) spacer before reaching the metal. Again, the bilayer of Au/Cu was cut to provide 67 parallel conductive strips per centimeter.

EXAMPLE 5

An Al layer was vapor deposited onto a 50 micron polyester film. A second 50 micron film of polyester was then adhesively bonded to the exposed surface of the Al layer to form a sandwich containing the Al layer between the two polyester layers. Using the laser and lens described in Example 2 at a power setting of 35 amps and a frequency of 5 KHz, the Al layer was cut into parallel conductive strips. This was accomplished without visual damage to either of the polyester films.

EXAMPLE 6

A thin layer of approximately 100 nm of indium-tin oxide was deposited onto glass. The smooth surface of the lenticular lens of Example 1 was placed on the indium tin oxide and was held in place with a vacuum hold down. The laser used in Example 2 was then used to expose the lenticular lens at 33 amps and 5 KHz. The indium-tin oxide layer was cut into 67 parallel conductive strips per centimeter.

EXAMPLE 7

To determine the effect of using a patterned lenticular lens, the embossed portion of several adjacent prism elements of the lenticular lens of Example 1 were machined flat. After skipping one of the prism elements, several more were removed in like fashion. This process was repeated several times to provide isolated prism elements. When this patterned lenticular lens was placed in contact with an Al layer on a polyester substrate and exposed to laser radiation as in Example 2, the result was that cutting occurred at preselected areas only under the remaining prism elements of the lenticular lens. An energy threshold thus exists so that concentration of the sub-threshold laser energy was necessary to cut the Al layer on the polyester. This demonstrates that a patterned lens could be used as a master for cutting patterns in thin metallic of other absorbent layers.

EXAMPLE 8

To demonstrate the ability to pattern layers containing reflective metal materials, a polyester film of about 50 microns thickness was vapor coated with about a 150 nm layer of Ag. Adjacent sections were then cut from this film and identified as Sample A and Sample B. Sample A was placed in a vacuum bell jar and also vapor coated with less than 50 nm of Ti. Sample A then had a bilayer of Ti/Ag on the polyester substrate while Sample B had only the Ag layer.

An experiment was carried out to study the cutting characteristics of these metal layers using the apparatus and method of the present invention. The smooth surface of the lenticular lens was placed in contact with the metal layers on each of the Samples A and B. The embossed surface of the lenticular lens was exposed to laser radiation as described in Example 2. The laser was operated at two power settings for each sample (a) 28 amps and 5 KHz, and (2) 35 amps and 5 KHz. The experimental results were that the Ti/Ag bilayer on Sample A was cut into parallel strips at both power settings while only occasional discontinuous cuts or holes were observed in the Ag layer on Sample B.

I claim:
1. A patterned sheet comprising a radiation absorbent layer containing multiple discontinuities extending transversely through the plane of said layer and wherein said radiation absorbent layer is confined between adjacent, radiation transparent layers, said radiation absorbent layer comprising both absorbent and reflective materials arranged so that the absorbent material receives incident radiation wherein at least one of said radiation transparent layers is a lenticular lens having fields of focus which lie at least partially within the plane of said absorbent layer and wherein the fields of focus of said lens correspond to the area of discontinuity of said absorbent layer.

2. A photovoltaic device comprising
  a) a conductive, radiation absorbent layer containing a pattern of multiple discontinuities extending transversely through the plane of said layer, said layer supported by a radiation transparent layer adjacent one major surface, said radiation transparent layer comprising a lenticular lens means having fields of focus which lie at least partially within the plane of said absorbent layer and wherein said fields of focus correspond to the areas of discontinuity of said absorbent layer, b) a conductive, pressure sensitive adhesive layer adhered to at least a portion of the major surface of said radiation absorbent layer opposite said radiation transparent layer, and c) a photovoltaic cell having its active surface electrically and physically connected to said conductive, radiation absorbent layer by said conductive adhesive.

3. A conductive sheet, comprising:

a) a conductive, radiation absorbent layer containing a pattern of multiple discontinuities extending transversely through the plane of said absorbent layer;

b) a radiation transparent layer adjacent one major surface of said absorbent layer for supporting said absorbent layer; wherein said radiation transparent layer comprises a lenticular lens means having fields of focus which lie at least partially within the plane of said absorbent layer and wherein the fields of focus of said lens means correspond to the areas of discontinuity of said absorbent layer; and c) a conductive, pressure sensitive adhesive layer adhered to at least a portion of the surface of said absorbent layer opposite said radiation transparent layer.

4. A method for patterning a radiation absorbent film comprising the following steps:

a) directing radiation from a radiation source onto a lenticular lens, b) focusing said radiation onto a radiation absorbent film, said film comprising a radiation absorbent region overlying a radiation reflective region, said radiation absorbent region capable of absorbing sufficient radiant energy to raise the temperature of the adjacent reflective region to a point where local discontinuities occur, wherein said film is in register with, but separable from said lens, said radiation forming a pattern on said film, c) disrupting said film in the radiation-incident areas as a result of absorption of the radiation by said film, and d) moving said lens and said film relative to one another.

* * * * *